(12) United States Patent
Zheng et al.

(10) Patent No.: US 10,884,080 B2
(45) Date of Patent: Jan. 5, 2021

(54) DUAL-NUCLEAR RF COIL DEVICE AND DUAL-NUCLEAR RF COIL ARRAY DEVICE

(71) Applicant: SHENZHEN INSTITUTES OF ADVANCED TECHNOLOGY, Shenzhen (CN)

(72) Inventors: Hairong Zheng, Shenzhen (CN); Ye Li, Shenzhen (CN); Qiaoyan Chen, Shenzhen (CN); Feng Du, Shenzhen (CN); Nan Li, Shenzhen (CN); Jo Lee, Shenzhen (CN); Chao Luo, Shenzhen (CN); Qiang He, Shenzhen (CN); Xin Liu, Shenzhen (CN)

(73) Assignee: SHENZHEN INSTITUTES OF ADVANCED TECHNOLOGY, Shenzhen (CN)

(*) Notice: Subject to any disclaimer, the term of this patent is extended or adjusted under 35 U.S.C. 154(b) by 51 days.

(21) Appl. No.: 16/348,917

(22) PCT Filed: Oct. 26, 2018

(86) PCT No.: PCT/CN2018/112138
§ 371 (c)(1),
(2) Date: May 10, 2019

(87) PCT Pub. No.: WO2020/000818
PCT Pub. Date: Jan. 2, 2020

(65) Prior Publication Data
US 2020/0300946 A1 Sep. 24, 2020

(30) Foreign Application Priority Data
Jun. 28, 2018 (CN) .......................... 2018 1 0686862

(51) Int. Cl.
*G01R 33/34* (2006.01)
*G01R 33/36* (2006.01)

(52) U.S. Cl.
CPC ... *G01R 33/34092* (2013.01); *G01R 33/3628* (2013.01)

(58) Field of Classification Search
CPC ...................... G01R 33/34092; G01R 33/3628
See application file for complete search history.

(56) References Cited

U.S. PATENT DOCUMENTS 10,132,884 B2 * 11/2018 Lakshmanan ...... G01R 33/3415
2003/0001572 A1 * 1/2003 Leussler ............ G01R 33/3628
324/318

(Continued)

FOREIGN PATENT DOCUMENTS

CN 103257331 2/2012
CN 103033778 4/2013
(Continued)

OTHER PUBLICATIONS

US 4,918,366 A, 04/1990, Mehdizadeh et al. (withdrawn)

*Primary Examiner* — Gregory H Curran
(74) *Attorney, Agent, or Firm* — Woodard, Emhardt, Henry, Reeves & Wagner LLP (57) ABSTRACT

A dual-nuclear radio frequency (RF) coil device includes a first RF coil and a second RF coil. The first RF coil includes at least one adjustment capacitor, the first RF coil is configured to generate a first magnetic field, and a direction of a primary magnetic field of the first magnetic field is a first direction. The second RF coil includes an electric dipole and a tuning and matching circuit connected between two conductors of the electric dipole. The second RF coil is configured to generate a second magnetic field and a direction of a primary magnetic field of the second magnetic field is a second direction; the electric dipole is disposed in a center line of the first RF coil and an insulating layer is disposed (Continued)

between the electric dipole and the first RF coil; and the first direction is perpendicular to the second direction.

18 Claims, 3 Drawing Sheets

(56) References Cited

U.S. PATENT DOCUMENTS

2007/0285096 A1 12/2007 Soutome et al.
2017/0214138 A1* 7/2017 Erturk ..................... H01Q 1/50

FOREIGN PATENT DOCUMENTS

| CN | 103576111 | 2/2014 |
| CN | 108680882 | 10/2018 |

* cited by examiner

DUAL-NUCLEAR RF COIL DEVICE AND DUAL-NUCLEAR RF COIL ARRAY DEVICE

The present application is a national stage application under 35 U.S.C. 371 based on international patent application PCT/CN2018/112138, filed on Oct. 26, 2018 which claims the priority of Chinese patent application No. 201810686862.2 filed on Jun. 28, 2018 to the CNIPA, disclosures of both of which are incorporated in the present application by reference in their entireties.

TECHNICAL FIELD

Embodiments of the present disclosure relate to the field of medical equipment, for example, to a dual-nuclear radio frequency (RF) coil device and a dual-nuclear RF coil array device.

BACKGROUND

Magnetic resonance imaging (MRI) is an imaging technique which performs image reconstruction by use of signals generated by resonance of a nucleus in a strong magnetic field. The basic principle of the MRI is described below. Some atoms with singular protons in human tissue, such as hydrogen atoms, can spin and generate magnetic moments. The spin directions of these small magnets are irregularly arranged under normal conditions and regularly arranged under the action of a fixed static magnetic field. At this time, when RF pulses with the same frequency as the static magnetic field are applied, these hydrogen atoms absorb a certain amount of energy to generate resonance and the spin directions are deflected under the action of the RF pulses and regularly arranged, which is the magnetic resonance phenomenon. After the RF pulses disappear, these hydrogen atoms will return to the original state. During the returning process, the hydrogen atoms release energy and change the spin directions. At this time, the signals generated by these hydrogen atoms are sampled and the captured signals are used for the image reconstruction to obtain a human tissue image. In the above process, a RF coil is used for transmitting the RF pulses and capturing magnetic resonance RF signals. With the rapid development of a multi-nuclear magnetic resonance imaging technology, the design of dual-nuclear RF coils has become an urgent problem to be solved.

At present, the existing dual-nuclear RF coils are designed in two manners. In one manner, two nuclei share a coil loop and in the loop, a fixed capacitor is connected in parallel with an inductor to achieve dual-nuclear resonance at high and low frequencies. The disadvantage of this manner is a low signal-to-noise ratio of a high-frequency coil and difficulty in implementing a match circuit at the high and low frequencies. In the other manner, two independent coil loops are used and coupling exists between the two coils, which directly affects the signal-to-noise ratio of the image. Moreover, current multi-nuclide MRI or spectral scanning is generally performed in a magnetic resonance system with a high magnetic field, such as systems with magnetic field strength of 3 tesla (3 T), 7 T and 9.4 T. For an MRI system, if the primary magnetic field has a higher intensity, the image has a better signal-to-noise ratio and resolution. However, images adopting the ultra-high field MRI system cannot achieve an ideal image quality because the image quality is not only related to the intensity of the primary magnetic field but also related to the radio frequency (RF) coils, the core components, for exciting and receiving the magnetic resonance signals. The higher intensity the primary magnetic field has, the higher the operating frequency of the RF coils, the shorter an RF wavelength and the more apparent non-uniformity an RF magnetic field has, which seriously affect the image contrast and image quality.

SUMMARY

Embodiments of the present disclosure provide a dual-nuclear RF coil device and a dual-nuclear RF coil array device to reduce coupling between dual-nuclear RF coils and improve uniformity of an RF magnetic field generated by the RF coils.

In an embodiment, the present disclosure provides a dual-nuclear RF coil device, including a first RF coil and a second RF coil.

The first RF coil is a loop structure and includes at least one adjustment capacitor, the first RF coil is configured to generate a first magnetic field, and a direction of a primary magnetic field of the first magnetic field is a first direction.

The second RF coil includes an electric dipole and a tuning and matching circuit connected between two conductors of the electric dipole. The second RF coil is configured to generate a second magnetic field and a direction of a primary magnetic field of the second magnetic field is a second direction; the electric dipole is disposed in a center line of the first RF coil, and an insulating layer is disposed between the electric dipole and the first RF coil; and the first direction is perpendicular to the second direction.

In an embodiment, the present disclosure further provides a dual-nuclear RF coil array device including a plurality of dual-nuclear RF coil devices according to any embodiment of the present disclosure arranged in an array.

DETAILED DESCRIPTION

The present disclosure will be described below in conjunction with the drawings and embodiments. The detailed description of the embodiments set forth below is intended to explain and not to limit the present disclosure. For ease of description, only part, not all, of structures related to the present disclosure are illustrated in the drawings.

Embodiment 1

Figure 1:
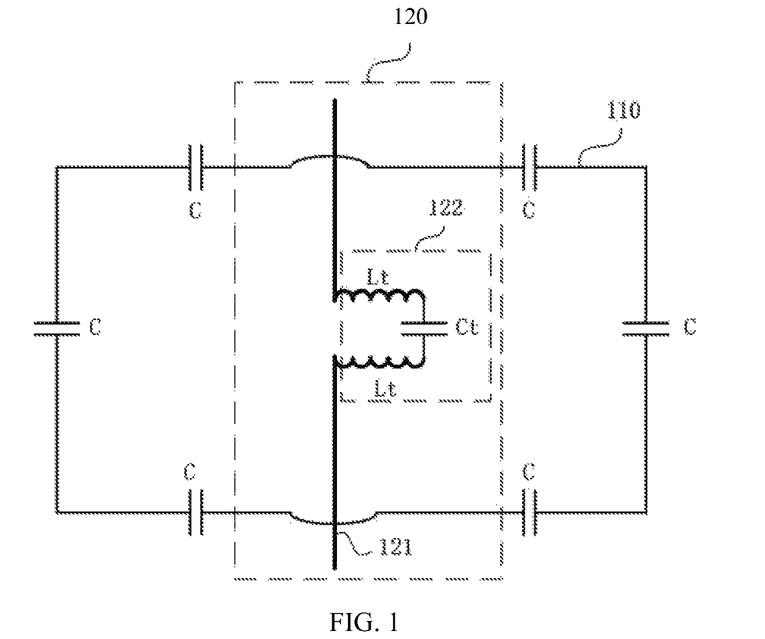
FIG. 1 is a structural diagram of a dual-nuclear RF coil device according to an embodiment 1 of the present disclosure.

FIG. 1 is a structural diagram of a dual-nuclear RF coil device according to an embodiment 1 of the present disclosure. A dual-nuclear RF coil provided in the embodiment can be applied to a multi-nuclide MRI system. As shown in FIG. 1, the dual-nuclear RF coil device includes a first RF coil 110 and a second RF coil 120.

The first RF coil 110 is a loop structure and includes at least one adjustment capacitor C. The first RF coil 110 is configured to generate a first magnetic field, and a direction of a primary magnetic field of the first magnetic field is a first direction.

The second RF coil 120 includes an electric dipole 121 and a tuning and matching circuit 122. The tuning and matching circuit 122 is connected between two conductors of the electric dipole 121. The second RF coil 120 is configured to generate a second magnetic field and a direction of a primary magnetic field of the second magnetic field is a second direction. The electric dipole 121 is disposed in a center line of the first RF coil 110. An insulating layer is disposed between the electric dipole 121 and the first RF coil 110. The first direction is perpendicular to the second direction.

In the embodiment, the first RF coil 110 is the loop structure and belongs to a magnetic dipole structure. The at least one adjustment capacitor C is disposed in the loop, and a resonant frequency of the first RF coil 110 may be adjusted by using different size adjustment capacitors C so that the resonant frequency of the first RF coil 110 is the same as the Larmor frequency of a nucleus corresponding to the first RF coil 110. The number of adjustment capacitors C is not limited to the number in FIG. 1 as long as the resonant frequency of the first RF coil 110 can be adjusted to be the same as the Larmor frequency of the nucleus corresponding to the first RF coil 110. In one embodiment, the dual-nuclear RF coil device further includes an adjustment capacitor Cm which is disposed in a first RF transmission line of the first RF coil 110. And impedance of the first RF coil 110 can be matched with impedance of the first RF transmission line by adjusting a size of the adjustment capacitor Cm.

In one embodiment, the second RF coil 120 is an electric dipole structure and includes the electric dipole 121 and the tuning and matching circuit 122. The tuning and matching circuit 122 is configured to adjust a resonant frequency of the second RF coil 120 so that the resonant frequency of the second RF coil 120 is the same as the Larmor frequency of a nucleus corresponding to the second RF coil 120. The tuning and matching circuit 122 is further configured to adjust impedance of the second RF coil 120 to match with impedance of a second RF transmission line connected to the second RF coil 120. The electric dipole structure can generate a uniform RF magnetic field when the electric dipole structure operates at a high resonance frequency. Therefore, under the primary magnetic field with a high intensity, the second RF coil 120 using the electric dipole structure can generate the uniform RF magnetic field and improve image quality.

In the embodiment, the electric dipole 121 of the second RF coil 120 is disposed in the center line of the first RF coil 110 to enable a direction of a primary RF magnetic field generated by the first RF coil 110 is perpendicular to a direction of a primary RF magnetic field generated by the second RF coil 120 so that a first RF magnetic field generated by the first RF coil 110 do not interfere with a second RF magnetic field generated by the second RF coil 120, thereby minimizing coupling between the first RF coil 110 and the second RF coil 120. As shown in FIG. 1, the direction of the primary RF magnetic field generated by the first RF coil 110 is perpendicular to a paper surface and the direction of the primary RF magnetic field generated by the second RF coil 120 is parallel to the paper surface. This shows that the direction of the primary RF magnetic field generated by the first RF coil 110 is orthogonal to the direction of the primary RF magnetic field generated by the second RF coil, thereby reducing the coupling between the first RF coil 110 and the second RF coil 120.

In the embodiment, the second RF coil 120 is applicable to a high resonant frequency, that is, applicable to a RF coil corresponding to a nuclear channel with a high Larmor frequency. With respect to the second RF coil 120, the first RF coil 110 is applicable to a low resonant frequency, that is, applicable to a RF coil corresponding to a nuclear channel with a low Larmor frequency. Taking nuclei 1H and 31P in a 7 T MRI system as examples, the Larmor frequency of 1H in the 7 T MRI system is 300 MHz and the Larmor frequency of 31P in the 7 T MRI system is 121 MHz. That is, an operating frequency of the RF coil corresponds to the 1H channel is 300 MHz, and an operating frequency of the RF coil corresponds to the 31P channel is 121 MHz. In terms of the dual-nuclear RF coil device according to the embodiments of the present disclosure, the first RF coil 110 may be taken as the RF coil corresponding to the 31P channel and the second RF coil 120 may be taken as the RF coil corresponding to the 1H channel so that images with high qualities may be generated when the nuclei corresponding to the two RF coils are respectively used for imaging.

In one embodiment, a size of the first RF coil and a size of the second RF coil according to the embodiments of the present disclosure are not limited by the embodiments of the present disclosure and the sizes of the RF coils may be set according to practical requirements. For example, the sizes of the RF coils are set according to an imaging part to which the RF coils are applied. In one embodiment, the dual-nuclear RF coils according to the embodiments of the present disclosure can be applied to a head, a limb, a cervical vertebra, a spine, an eye socket, a chest and the like.

The dual-nuclear RF coil device according to the embodiments of the present disclosure includes the first RF coil and the second RF coil. The first RF coil is the loop structure and includes the at least one adjustment capacitor. The first RF coil is configured to generate the first magnetic field, and the direction of the primary magnetic field of the first magnetic field is the first direction. The second RF coil includes the electric dipole and the tuning and matching circuit and the tuning and matching circuit is connected between the two conductors of the electric dipole. The second RF coil is configured to generate the second magnetic field and the direction of the primary magnetic field of the second magnetic field is the second direction. The electric dipole is disposed in the center line of the first RF coil, and an insulating layer is disposed between the electric dipole and the first RF coil. The first direction is perpendicular to the second direction, thereby reducing the coupling between the dual-nuclear RF coils, improving uniformity of the RF magnetic fields generated by the RF coils under the high magnetic field intensity, and improving a signal-to-noise ratio of the image and the image quality.

Based on the above solution, the electric dipole includes a first conductor and a second conductor. An end of the tuning and matching circuit is connected to an end of the first conductor adjacent to the second conductor and the other end of the tuning and matching circuit is connected to an end of the second conductor adjacent to the first conductor. The tuning and matching circuit includes at least one tuning and matching capacitor and at least one tuning and matching inductor which are connected in series.

In one embodiment, the electric dipole is composed of the first conductor and the second conductor, and the first conductor and the second conductor are symmetrically distributed on two sides of the tuning and matching circuit 122. As shown in FIG. 1, the tuning and matching circuit 122 includes a tuning and matching capacitor Ct and two tuning and matching inductors Lt. Each of two ends of the tuning and matching capacitor Ct is connected to a respective one of the two tuning and matching inductors Lt, and the other end of each of the two tuning and matching inductors Lt is connected to a respective one of the first conductor and the second conductor.

In one embodiment, a length of the first conductor and a length of the second conductor are the same and adjustable. In one embodiment, each of the length of the first conductor and the length of the second conductor is a quarter of a wavelength. The wavelength is determined by the resonant frequency of the second RF coil. When the resonant frequency of the second RF coil changes, the length of the first conductor and the length of the second conductor may be accordingly adjusted, to adapt to MRI corresponding to different nuclei. In one embodiment, the first conductor and the second conductor have a flat belt-shaped structure or a cylindrical rod-shaped structure. The first conductor and the second conductor are configured as the flat belt-shaped structure or the cylindrical rod-shaped structure so that it is more convenient to adjust the length of the first conductor and the length of the second conductor. In one embodiment, when a change of the nuclear channel corresponding to the second RF coil results in a change of the resonant frequency of the second RF coil, the lengths of the first conductor and the second conductor and the resonant frequency of the second RF coil can be matched with each other by replace the first conductor and the second conductor.

Embodiment 2

Figure 2:
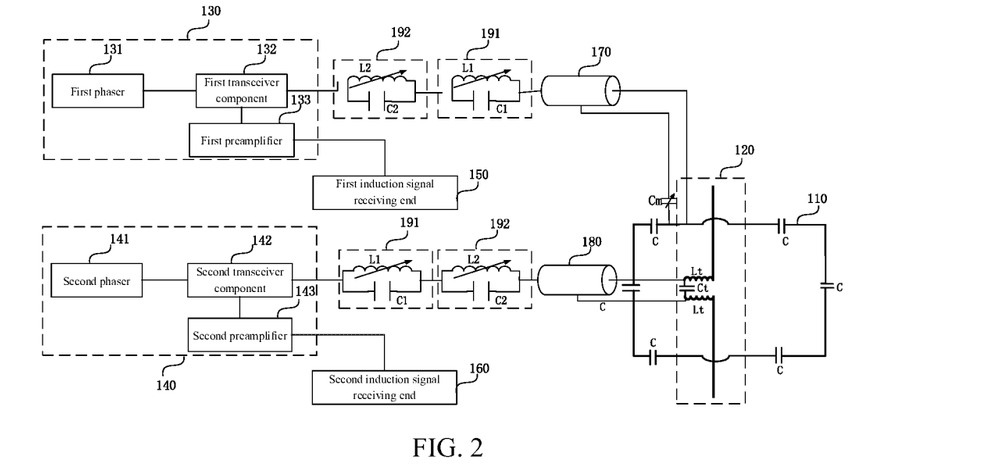
FIG. 2 is a structural diagram of a dual-nuclear RF coil device according to an embodiment 2 of the present disclosure.

FIG. 2 is a structural diagram of a dual-nuclear RF coil device according to an embodiment 2 of the present disclosure. In the embodiment based on the above embodiments, a first signal transmission circuit and a second signal transmission circuit are respectively connected to a first RF coil and a second RF coil. As shown in FIG. 2, the dual-nuclear RF coil device further includes a first signal transmission circuit 130 and a second signal transmission circuit 140.

A receiving end of the first signal transmission circuit 130 is connected to an excitation signal output end, a coil end of the first signal transmission circuit 130 is connected to the first RF coil 110, and a transmitting end of the first signal transmission circuit 130 is connected to a first induction signal receiving end 150. The first signal transmission circuit 130 is configured to transmit an excitation signal outputted from the excitation signal output end to the first RF coil 110, or transmit an induction signal generated by the first RF coil 110 to the first induction signal receiving end 150.

A receiving end of the second signal transmission circuit 140 is connected to the excitation signal output end, a coil end of the second signal transmission circuit 140 is connected to the second RF coil 120, and a transmitting end of the second signal transmission circuit 140 is connected to a second induction signal receiving end 160. The second signal transmission circuit 140 is configured to transmit the excitation signal outputted from the excitation signal output end to the second RF coil 120, or transmit an induction signal generated by the second RF coil 120 to the second induction signal receiving end 160.

In the embodiment, both the first RF coil 110 and the second RF coil 120 can integrate a function of transmitting RF pulses and a function of capturing magnetic resonance RF signals. The first RF coil 110 and the second RF coil 120 in the dual-nuclear RF coil device according to the embodiments of the present disclosure have similar working processes. Here, the first RF coil 110 is taken as an example to describe a working process of the RF coil.

In one embodiment, a working process of the first RF coil 110 in the dual-nuclear RF coil device according to the embodiments of the present disclosure is described below. When the first RF coil 110 operates in a transmitting phase, the first signal transmission circuit 130 receives the excitation signal outputted from the excitation signal output end through the receiving end, and transmits the excitation signal to the first RF coil 110 through the coil end of the first signal transmission circuit 130; and the first RF coil 110 generates a first RF magnetic field under excitation of the excitation signal. When the first RF coil 110 operates in a receiving phase, the induction signal generated by the first RF coil 110 is transmitted to the first induction signal receiving end 150 through the transmitting end of the first signal transmission circuit 130, and the first induction signal receiving end 150 receives the induction signal and transmits the induction signal to an imaging device which reconstructs the received induction signal into a corresponding image.

Based on the above solution, the first signal transmission circuit 130 is connected to the first RF coil 110 through a first coaxial cable 170, and the first coaxial cable 170 is provided with two filter circuits of different frequencies (a first filter circuit 192 and a second filter circuit 192). The first filter circuit 191 corresponding to an operating frequency of the first RF coil 110 is disposed closer to the first RF coil 110 than the second filter circuit 192.

The second signal transmission circuit 140 is connected to the second RF coil 120 through a second coaxial cable 180, and the second coaxial cable 180 is provided with two filter circuits of different frequencies (the first filter circuit 191 and the second filter circuit 192). The second filter circuit 192 corresponding to an operating frequency of the second RF coil 120 is disposed closer to the second RF coil 120 than the first filter circuit 191.

In the embodiment, considering that the coaxial cables can also sense the signals to generate currents of different frequencies under different operating frequencies of the RF coils, To prevent the currents of different frequencies generated by the coaxial cables due to the induction signals from passing through the RF coils, two filter circuits of different frequencies are disposed on the coaxial cable of each RF coil and the filter circuit corresponding to the operating frequency of the RF coil is disposed adjacent to the RF coil and the other filter circuit is disposed after the filter circuit adjacent to the RF coil. The filter circuits are disposed in such a manner to prevent the current generated by the coaxial cable due to the induction signal flowing into the RF coil, thereby reducing coupling between the two RF coils. In one embodiment, the first filter circuit 191 includes an inductor L1 and a capacitor C1, and the second filter circuit includes an inductor L2 and a capacitor C2.

Based on the above solution, the first signal transmission circuit 130 and the second signal transmission circuit 140 each includes a phaser, a transceiver component and a preamplifier. An input end of the phaser is connected to the excitation signal output end, and the phaser is configured to receive the excitation signal, perform phase adjustment on the excitation signal and output the excitation signal subject to the phase adjustment through an output end of the phaser. A receiving end of the transceiver component is connected to the output end of the phaser, a coil end of the transceiver component is connected to the RF coil, and a transmitting end of the transceiver component is connected to an input end of the preamplifier. The transceiver component is configured to output the excitation signal subject to the phase adjustment to the RF coil, or output the induction signal generated by the RF coil to the preamplifier. The preamplifier is configured to amplify the induction signal. In one embodiment, the preamplifier is a low noise amplifier to reduce interference of noise signals generated by the amplifier itself and improve a signal-to-noise ratio of the outputted induction signal.

As shown in FIG. 2, the first signal transmission circuit 130 includes a first phaser 131, a first transceiver component 132 and a first preamplifier 133. An input end of the first phaser 131 is connected to the excitation signal output end; a receiving end of the first transceiver component 132 is connected to an output end of the first phaser 131, a coil end of the first transceiver component 132 is connected to the first RF coil 110, and a transmitting end of the first transceiver component 132 is connected to an input end of the first preamplifier 133.

The second signal transmission circuit 140 includes a second phaser 141, a second transceiver component 142 and a second preamplifier 143. An input end of the second phaser 141 is connected to the excitation signal output end; a receiving end of the second transceiver component 142 is connected to an output end of the second phaser 141, a coil end of the second transceiver component 142 is connected to the second RF coil 120, and a transmitting end of the second transceiver component 142 is connected to an input end of the second preamplifier 143.

In the embodiment, both the first signal transmission circuit 130 and the second signal transmission circuit 140 can implement a function of transmitting the excitation signal to the RF coil and transmitting the induction signal generated by the RF coil to the induction signal receiving end. The first signal transmission circuit 130 and the second signal transmission circuit 140 in the dual-nuclear RF coil device according to the embodiments of the present disclosure have similar signal transmission processes. Hereinafter, the first signal transmission circuit 130 is taken as an example to describe the signal transmission process.

In one embodiment, the signal transmission process of the first signal transmission circuit 130 in the dual-nuclear RF coil device according to the embodiments of the present disclosure is described below. When the first RF coil 110 operates in the transmitting phase, the first phaser 131 receives the excitation signal outputted from the excitation signal output end through the input end, performs phase shifting on the excitation signal and transmits the excitation signal subject to the phase adjustment to the first transceiver component 132 which operates in a transmitting mode through the output end of the first phaser 131; and the first transceiver component 132 transmits the excitation signal subject to the phase adjustment to first RF coil 110. When the first RF coil 110 operates in the receiving phase, the induction signal generated by the first RF coil 110 is transmitted to the first preamplifier 133 through the first transceiver component 132 which operates in a receiving mode, and the first preamplifier 133 amplifies the received induction signal and transmits the amplified induction signal to the first induction signal receiving end 150. In one embodiment, the induction signal generated by the first RF coil 110 is a magnetic resonance voltage signal generated by the first RF coil 110.

Based on the above solution, the transceiver component includes a diode and an isolation circuit. An anode of the diode is connected to the output end of the phaser, a cathode of the diode is connected to an end of the isolation circuit and the RF coil respectively, and the other end of the isolation circuit is connected to the preamplifier. In the embodiment, the first transceiver component 132 and the second transceiver component 142 have similar circuit structures. Here, the first transceiver component 132 is taken as an example to specifically describe a circuit structure of the transceiver component.

Figure 3:
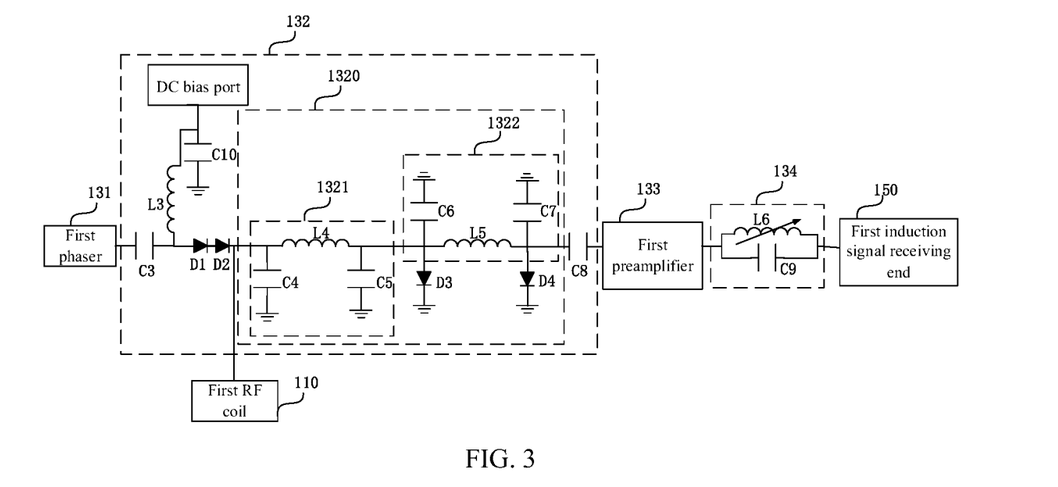
FIG. 3 is a circuit structure diagram illustrating a first transceiver component in the dual-nuclear RF coil device according to the embodiment 2 of the present disclosure.

FIG. 3 is a circuit structure diagram illustrating a first transceiver component 132 in the dual-nuclear RF coil device according to the embodiment 2 of the present disclosure. As shown in FIG. 3, the first transceiver component 132 includes a diode D1 and a first isolation circuit 1320.

An anode of the diode D1 is connected to the output end of the first phaser 131, a cathode of the diode D1 is connected to an end of the first isolation circuit 1320 and the first RF coil 110 respectively, and the other end of the first isolation circuit 1320 is connected to the first preamplifier 133.

In one embodiment, the first isolation circuit 1320 includes a first π-type network circuit 1321 and a second π-type network circuit 1322. The first π-type network circuit 1321 includes a first capacitor C4, a second capacitor C5 and a first inductor L4. The second π-type network circuit 1322 includes a third capacitor C6, a fourth capacitor C7 and a second inductor L5.

An end of the first capacitor C4 is connected to the cathode of the diode and an end of the first inductor L4 respectively and the other end of the first capacitor C4 is grounded. The other end of the first inductor L4 is connected to an end of the second capacitor C5, an end of the third capacitor C6 and an end of the second inductor L5 respectively. The other end of the second capacitor C5 and the other end of the third capacitor C6 are grounded. The other end of the second inductor L5 is connected to an end of the fourth capacitor C7 and the first preamplifier 133 respectively, and the other end of the fourth capacitor C7 is grounded.

In one embodiment, the first transceiver component 132 and the first preamplifier 133 may be integrated on a same circuit board. When the first RF coil 110 operates in the transmitting phase, the diode in the first transceiver component 132 is forward biased, and input impedance of the first isolation circuit 1320 is very large and equivalent to an open circuit so that the excitation signal is transmitted to the first RF coil 110 through the diode. When the first RF coil 110 operates in the receiving phase, the diode in the first transceiver component 132 is turned off and the π-type network circuits in the first isolation circuit 1320 are equivalent to a quarter-wavelength line for impedance transformation to match the impedance of the receiving end with the impedance of the first RF coil 110 so that the induction signal generated by the first RF coil 110 is transmitted to the first preamplifier 133 through the first isolation circuit 1320, thereby isolating a transmitting channel and a receiving channel in the first transceiver component 132 and solving the problem of mutual interference between the transmitting channel and the receiving channel.

In the embodiment, the quarter-wavelength line is replaced with π-type networks and a transceiver circuit is constituted by combining the diode with the π-type networks, implementing integrated transmitting and receiving functions of the RF coil, simplifying a structure of the RF coil, and reducing circuit debugging complexity of the RF coil and coil costs.

In one embodiment, the dual-nuclear RF coil device further includes a third filter circuit 134 disposed between the first preamplifier 133 and the first induction signal receiving end 150. The third filter circuit 134 is disposed after the first preamplifier 133 to reduce the mutual interference between the transmitting channel and the receiving channel. In one embodiment, the third filter circuit 134 includes an inductor L6 and a capacitor C9.

In one embodiment, the first transceiver component 132 further includes a capacitor C3, a diode D2, an inductor L3, a capacitor C10, a diode D3, a diode D4 and a capacitor C8. The capacitor C3 for filtering is connected between the first phaser 131 and the diode D1. An anode of the diode D2 is connected to the diode D1, and a cathode of diode D2 is connected to the first isolation circuit 1320, and the diode D2 is configured to cooperate with the diode D1 to increase a reverse breakdown voltage of the diode. An end of the inductor L3 is connected to the output end of the first phaser 131, the other end of the inductor L3 is connected to the capacitor C10 and a direct current (DC) bias port respectively, and the other end of the capacitor C10 is grounded. The inductor L3 and the capacitor C10 are configured to filter a signal inputted from the DC bias port. An anode of the diode D3 is connected to an end of the capacitor C5, an end of the inductor L5, and a cathode of the diode D3 is grounded. An anode of the diode D4 is connected to an end of the inductor L5 and an end of the capacitor C7, and a cathode of the diode D4 is grounded. The capacitor C8 for filtering is connected between the inductor L5 and the first preamplifier 133.

In one embodiment, an electromagnetic field simulating calculation is performed on the dual-nuclear RF coil device according to the embodiments of the present disclosure. Simulation results show that the dual-nuclear RF coil device according to the embodiments of the present disclosure can generate a relatively uniform RF magnetic field at a high frequency. Nuclei 1H and 31P are used for performing an experimental test on the dual-nuclear RF coil device according to the embodiments of the present disclosure. Test results show that isolation between a 1H channel and a 31P channel is at least less than −26 dB and isolation between the transmitting channel and the receiving channel is at least less than −25 dB. Experimental results show that the dual-nuclear RF coil device according to the embodiments of the present disclosure achieves better isolation between a nuclear channel corresponding to the first RF coil and a nuclear channel corresponding to the second RF coil, and better isolation between the transmitting channel and the receiving channel of the dual-nuclear RF coil.

In the dual-nuclear RF coil device according to the embodiments of the present disclosure, filter circuits of different frequencies are disposed in the signal transmission circuits of a plurality of RF coils: one filter circuit corresponding to the operating frequency of the RF coil is disposed adjacent to the RF coil, and the other filter circuit is disposed after the one filter circuit, reducing the coupling between the two RF coils; and the π-type networks are used, achieving the isolation between the transmitting channel and the receiving channel of the same RF coil.

Embodiment 3

The embodiment provides a dual-nuclear RF coil array device including a plurality of dual-nuclear RF coil devices according to any embodiment of the present disclosure arranged in an array. In one embodiment, a number of dual-nuclear RF coil devices in the dual-nuclear RF coil array device may be determined by the number of channels and a structure of the dual-nuclear RF coil array device may be set according to an imaging part. The structure and a system framework of the dual-nuclear RF coil array device are described using an example of four channels in the embodiments of the present disclosure.

Figure 4:
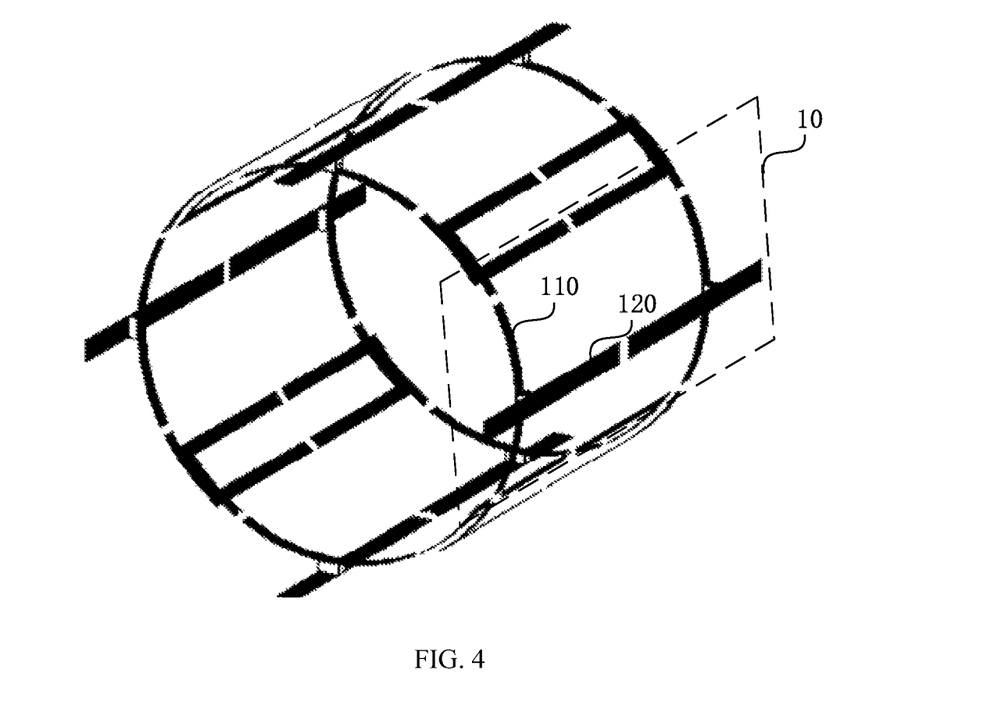
FIG. 4 is a structural diagram of a dual-nuclear RF coil array device according to an embodiment 3 of the present disclosure.
Figure 5:
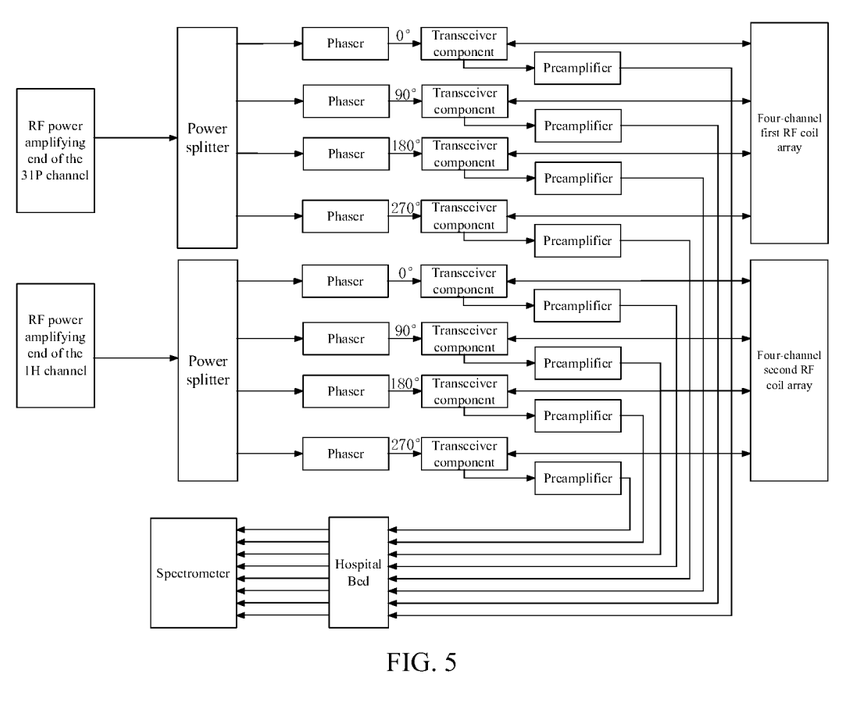
FIG. 5 is a system framework diagram illustrating the dual-nuclear RF coil array device according to the embodiment 3 of the present disclosure.

FIG. 4 is a structural diagram of a dual-nuclear RF coil array device according to an embodiment 3 of the present disclosure. FIG. 5 is a system framework diagram illustrating the dual-nuclear RF coil array device according to the embodiment 3 of the present disclosure. Taking a four-channel dual-nuclear RF coil array as an example, FIG. 4 exemplarily shows the structure of the four-channel dual-nuclear RF coil array. As shown in FIG. 4, the dual-nuclear RF coil array device includes four dual-nuclear RF coils 10, each of which includes a first RF coil 110 of a loop structure and a second RF coil 120 of an electric dipole structure.

Taking the four-channel dual-nuclear RF coil array as an example, FIG. 5 exemplarily shows the system framework of the four-channel dual-nuclear RF coil array. As shown in FIG. 5, each of the four channels in the dual-nuclear RF coil array device includes a power splitter, a phaser, a transceiver component, a preamplifier and a dual-nuclear RF coil. In one embodiment, when the dual-nuclear RF coils operate in a transmitting phase, an excitation signal outputted from a RF power amplifying end is divided by the power splitter into four signals of an equal amplitude (the distribution losses are 6 dB), each excitation signal passes through coaxial lines of different lengths for phase shifting, and the each excitation signal subject to the phase shifting is transmitted to a RF coil through the transceiver component operating in a transmitting mode to excite each RF coil to generate a corresponding RF magnetic field, thereby achieving orthogonal excitation of the four-channel RF coil array to generate a circularly polarized emission field. When the dual-nuclear RF coils operate in a receiving phase, diodes in the transceiver component are turned off, and the preamplifier and a DC bias circuit operate so that each induction signal received from each of the RF coil is amplified and transmitted to a spectrometer past a hospital bed to complete image reconstruction.

In one embodiment, to reduce insertion losses of cascaded modules, the phase shifters use the coaxial lines of different lengths for the phase shifting. For example, a coaxial line with a short length X is taken as an initial phase (0°) and then three coaxial lines of lengths $X+\lambda/4$, $X+2\lambda/4$ and $X+3\lambda/4$ are used respectively to implement the phase shifting of 90°, 180° and 270°.

In the dual-nuclear RF coil array device according to the embodiments of the present disclosure, the first RF coil is configured as the loop structure and the second RF coil is configured as the electric dipole structure so that the dual-nuclear RF coil array can generate the relatively uniform RF magnetic field under the high frequency and achieve isolation between channels corresponding to the two RF coils; π-type network circuits are used, achieving isolation between the transmitting channel and a receiving channel of the dual-nuclear RF coil. A signal-to-noise ratio and a quality of an image are improved.

What is claimed is:

1. A dual-nuclear radio frequency (RF) coil device, comprising: a first RF coil and a second RF coil;
    wherein the first RF coil is a loop structure and comprises at least one adjustment capacitor, the first RF coil is configured to generate a first magnetic field, and a direction of a primary magnetic field of the first magnetic field is a first direction; and
    the second RF coil comprises an electric dipole, and a tuning and matching circuit connected between two conductors of the electric dipole, wherein the second RF coil is configured to generate a second magnetic field, and a direction of a primary magnetic field of the second magnetic field is a second direction; the electric dipole is disposed in a center line of the first RF coil, and an insulating layer is disposed between the electric dipole and the first RF coil; and the first direction is perpendicular to the second direction.

2. The device of claim 1, wherein the electric dipole comprises a first conductor and a second conductor, wherein an end of the tuning and matching circuit is connected to an end of the first conductor adjacent to the second conductor and the other end of the tuning and matching circuit is connected to an end of the second conductor adjacent to the first conductor; and the tuning and matching circuit comprises at least one tuning and matching capacitor and at least one tuning and matching inductor which are connected in series.

3. The device of claim 2, wherein a length of the first conductor and a length of the second conductor are the same and adjustable.

4. The device of claim 3, wherein the first conductor and the second conductor have a flat belt-shaped structure or a cylindrical rod-shaped structure.

5. The device of claim 1, further comprising: a first signal transmission circuit and a second signal transmission circuit;

wherein a receiving end of the first signal transmission circuit is connected to an excitation signal output end, a coil end of the first signal transmission circuit is connected to the first RF coil, and a transmitting end of the first signal transmission circuit is connected to a first induction signal receiving end; and the first signal transmission circuit is configured to transmit an excitation signal outputted from the excitation signal output end to the first RF coil, or transmit an induction signal generated by the first RF coil to the first induction signal receiving end; and wherein a receiving end of the second signal transmission circuit is connected to the excitation signal output end, a coil end of the second signal transmission circuit is connected to the second RF coil, and a transmitting end of the second signal transmission circuit is connected to a second induction signal receiving end; and the second signal transmission circuit is configured to transmit the excitation signal outputted from the excitation signal output end to the second RF coil, or transmit an induction signal generated by the second RF coil to the second induction signal receiving end.

6. The device of claim 5, wherein
the first signal transmission circuit is connected to the first RF coil through a first coaxial cable, the first coaxial cable is provided with two filter circuits with different frequencies, and one of the two filter circuits that is corresponding to an operating frequency of the first RF coil is disposed closer to the first RF coil than the other one of the two filter circuits; and
the second signal transmission circuit is connected to the second RF coil through a second coaxial cable, the second coaxial cable is provided with two filter circuits with different frequencies, and one of the two filter circuits that is corresponding to an operating frequency of the second RF coil is disposed closer to the second RF coil than the other one of the two filter circuits.

7. The device of claim 5, wherein each of the first signal transmission circuit and the second signal transmission circuit comprises a phaser, a transceiver component and a preamplifier;

wherein an input end of the phaser is connected to the excitation signal output end, and the phaser is configured to receive the excitation signal, perform phase adjustment on the excitation signal and output excitation signal subject to the phase adjustment through an output end of the phaser;

a receiving end of the transceiver component is connected to the output end of the phaser, a coil end of the transceiver component is connected to an RF coil, and a transmitting end of the transceiver component is connected to an input end of the preamplifier; and the transceiver component is configured to output the excitation signal subject to the phase adjustment to the RF coil, or output the induction signal generated by the RF coil to the preamplifier; and the preamplifier is configured to amplify the induction signal.

8. The device of claim 7, wherein the transceiver component comprises a diode and an isolation circuit;

wherein an anode of the diode is connected to the output end of the phaser, a cathode of the diode is connected to an end of the isolation circuit and the RF coil respectively, and the other end of the isolation circuit is connected to the preamplifier.

9. The device of claim 8, wherein the isolation circuit comprises a first n-type network circuit and a second n-type network circuit; wherein the first t-type network circuit comprises a first capacitor, a second capacitor and a first inductor; and the second n-type network circuit comprises a third capacitor, a fourth capacitor and a second inductor; and wherein an end of the first capacitor is connected to the cathode of the diode and an end of the first inductor respectively; the other end of the first capacitor is grounded; the other end of the first inductor is connected to an end of the second capacitor, an end of the third capacitor and an end of the second inductor respectively; the other end of the second capacitor and the other end of the third capacitor are grounded; the other end of the second inductor is connected to an end of the fourth capacitor and the preamplifier respectively; and the other end of the fourth capacitor is grounded.

10. A dual-nuclear radio frequency (RF) coil array device, comprising a plurality of dual-nuclear RF coil devices arranged in an array, wherein each of the dual-nuclear RF coil devices comprises a first RF coil and a second RF coil:

wherein the first RF coil is a loop structure and comprises at least one adjustment capacitor, the first RF coil is configured to generate a first magnetic field, and a direction of a primary magnetic field of the first magnetic field is a first direction; and the second RF coil comprises an electric dipole, and a tuning and matching circuit connected between two conductors of the electric dipole, wherein the second RF coil is configured to generate a second magnetic field, and a direction of a primary magnetic field of the second magnetic field is a second direction; the electric dipole is disposed in a center line of the first RF coil, and an insulating layer is disposed between the electric dipole and the first RF coil; and the first direction is perpendicular to the second direction.

11. The device of claim 10, wherein the electric dipole comprises a first conductor and a second conductor, wherein an end of the tuning and matching circuit is connected to an end of the first conductor adjacent to the second conductor and the other end of the tuning and matching circuit is connected to an end of the second conductor adjacent to the first conductor; and the tuning and matching circuit comprises at least one tuning and matching capacitor and at least one tuning and matching inductor which are connected in series.

12. The device of claim 11, wherein a length of the first conductor and a length of the second conductor are the same and adjustable.

13. The device of claim 12, wherein the first conductor and the second conductor have a flat belt-shaped structure or a cylindrical rod-shaped structure.

14. The device of claim 10, wherein the each of the dual-nuclear RF coil devices further comprises a first signal transmission circuit and a second signal transmission circuit;

wherein a receiving end of the first signal transmission circuit is connected to an excitation signal output end, a coil end of the first signal transmission circuit is connected to the first RF coil, and a transmitting end of the first signal transmission circuit is connected to a first induction signal receiving end; and the first signal transmission circuit is configured to transmit an excitation signal outputted from the excitation signal output end to the first RF coil, or transmit an induction signal generated by the first RF coil to the first induction signal receiving end; and wherein a receiving end of the second signal transmission circuit is connected to the excitation signal output end, a coil end of the second signal transmission circuit is connected to the second RF coil, and a transmitting end of the second signal transmission circuit is connected to a second induction signal receiving end; and the second signal transmission circuit is configured to transmit the excitation signal outputted from the excitation signal output end to the second RF coil, or transmit an induction signal generated by the second RF coil to the second induction signal receiving end.

15. The device of claim 14, wherein the first signal transmission circuit is connected to the first RF coil through a first coaxial cable, the first coaxial cable is provided with two filter circuits with different frequencies, and one of the two filter circuits that is corresponding to an operating frequency of the first RF coil is disposed closer to the first RF coil than the other one of the two filter circuits; and the second signal transmission circuit is connected to the second RF coil through a second coaxial cable, the second coaxial cable is provided with two filter circuits with different frequencies, and one of the two filter circuits that is corresponding to an operating frequency of the second RF coil is disposed closer to the second RF coil than the other one of the two filter circuits.

16. The device of claim 14, wherein each of the first signal transmission circuit and the second signal transmission circuit comprises a phaser, a transceiver component and a preamplifier;

wherein an input end of the phaser is connected to the excitation signal output end, and the phaser is configured to receive the excitation signal, perform phase adjustment on the excitation signal and output excitation signal subject to the phase adjustment through an output end of the phaser;

a receiving end of the transceiver component is connected to the output end of the phaser, a coil end of the transceiver component is connected to an RF coil, and a transmitting end of the transceiver component is connected to an input end of the preamplifier; and the transceiver component is configured to output the excitation signal subject to the phase adjustment to the RF coil, or output the induction signal generated by the RF coil to the preamplifier; and the preamplifier is configured to amplify the induction signal.

17. The device of claim 16, wherein the transceiver component comprises a diode and an isolation circuit;

wherein an anode of the diode is connected to the output end of the phaser, a cathode of the diode is connected to an end of the isolation circuit and the RF coil respectively, and the other end of the isolation circuit is connected to the preamplifier.

18. The device of claim 17, wherein the isolation circuit comprises a first i-type network circuit and a second n-type network circuit; wherein the first n-type network circuit comprises a first capacitor, a second capacitor and a first inductor; and the second n-type network circuit comprises a third capacitor, a fourth capacitor and a second inductor; and wherein an end of the first capacitor is connected to the cathode of the diode and an end of the first inductor respectively; the other end of the first capacitor is grounded; the other end of the first inductor is connected to an end of the second capacitor, an end of the third capacitor and an end of the second inductor respectively; the other end of the second capacitor and the other end of the third capacitor are grounded; the other end of the second inductor is connected to an end of the fourth capacitor and the preamplifier respectively; and the other end of the fourth capacitor is grounded.

* * * * *

UNITED STATES PATENT AND TRADEMARK OFFICE
CERTIFICATE OF CORRECTION

PATENT NO.       : 10,884,080 B2
APPLICATION NO.  : 16/348917
DATED            : January 5, 2021
INVENTOR(S)      : Hairong Zheng Page 1 of 1

It is certified that error appears in the above-identified patent and that said Letters Patent is hereby corrected as shown below:

On the Title Page

Item (72) insert the ninth inventor's name:
--Hang Ou, Shenzhen (CN)--

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*